(12) United States Patent
Patterson

(10) Patent No.: US 6,846,701 B2
(45) Date of Patent: *Jan. 25, 2005

(54) TRACELESS FLIP CHIP ASSEMBLY AND METHOD

(75) Inventor: Timothy Patterson, Costa Mesa, CA (US)

(73) Assignee: Saturn Electronics & Engineering, Inc., Auburn Hills, MI (US)

( * ) Notice: Subject to any disclaimer, the term of this patent is extended or adjusted under 35 U.S.C. 154(b) by 3 days.

This patent is subject to a terminal disclaimer.

(21) Appl. No.: 10/411,981

(22) Filed: Apr. 11, 2003

(65) Prior Publication Data

US 2003/0224556 A1 Dec. 4, 2003

Related U.S. Application Data

(63) Continuation-in-part of application No. 09/793,288, filed on Feb. 26, 2001, now Pat. No. 6,571,468.

(51) Int. Cl.⁷ .......................... H01L 21/44; H01L 21/48; H01L 21/50
(52) U.S. Cl. ..................... 438/108; 438/613; 438/614; 438/615; 257/737; 257/738
(58) Field of Search ................................ 257/737–738; 438/613–617, 111–112, 123; 228/180.22; 29/832, 834–835, 846–847, 840–841; 361/767, 813

(56) References Cited

U.S. PATENT DOCUMENTS

| | | | |
|---|---|---|---|
| 3,676,922 A | | 7/1972 | Cook, Jr. |
| 3,745,648 A | | 7/1973 | Wiesner |
| 3,947,867 A | * | 3/1976 | Duffek et al. ............... 257/669 |
| 4,047,290 A | | 9/1977 | Weitze et al. |
| 4,246,595 A | * | 1/1981 | Noyori et al. ............... 257/668 |
| 5,300,812 A | * | 4/1994 | Lupinski et al. ............. 257/723 |
| 5,302,547 A | * | 4/1994 | Wojnarowski et al. ........ 216/41 |
| 5,728,606 A | * | 3/1998 | Laine et al. ................. 438/122 |
| 5,784,780 A | | 7/1998 | Loo |
| 5,923,955 A | | 7/1999 | Wong |
| 5,998,875 A | | 12/1999 | Bodo et al. |
| 6,207,330 B1 | * | 3/2001 | Balz et al. ..................... 430/13 |
| 6,219,254 B1 | | 4/2001 | Akerling et al. |
| 6,326,244 B1 | | 12/2001 | Brooks et al. |
| 6,538,209 B1 | * | 3/2003 | Ouchi et al. ................. 174/256 |
| 6,552,416 B1 | * | 4/2003 | Foster .......................... 257/666 |
| 6,571,468 B1 | * | 6/2003 | Patterson et al. ............. 29/852 |
| 6,635,957 B2 | * | 10/2003 | Kwan et al. ................. 257/691 |
| 2001/0052647 A1 | * | 12/2001 | Plepys et al. ................ 257/738 |

FOREIGN PATENT DOCUMENTS

| | | |
|---|---|---|
| EP | 480703 A2 | 9/1991 |
| EP | DP480703 A3 | 6/1992 |
| FR | 2535110 A1 | 10/1982 |

* cited by examiner

Primary Examiner—Amir Zarabian
Assistant Examiner—Thanh Y. Tran
(74) Attorney, Agent, or Firm—Rader, Fishman & Grauer PLLC

(57) ABSTRACT

A method for forming a fine-pitch flip chip assembly interconnects fine pitch devices after they have been connected to a carrier substrate. A die having a plurality of conductive sections, such as solder balls, is attached to a conductive layer of the substrate. An interconnect pattern is then formed in the conductive layer to connect the conductive sections and generate electronic functionality to the assembly. By forming the interconnect pattern after the device have been connected to the carrier, the invention provides precise alignment between the devices and the interconnect pattern without actually aligning the two components during the assembly process.

16 Claims, 5 Drawing Sheets

TRACELESS FLIP CHIP ASSEMBLY AND METHOD

REFERENCE TO RELATED APPLICATIONS

This application is a continuation-in-part of on U.S. patent application Ser. No. 09/793,288 filed Feb. 26, 2001 now U.S. Pat. No. 6,571,468.

FIELD OF THE INVENTION

The present invention relates to semiconductor devices, and more particularly to an assembly and method for constructing chip assemblies having fine pitch interconnections.

DESCRIPTION OF THE RELATED ART

Currently, electronic devices require faster and more compact systems that pack a greater number of components into a smaller chip substrate area. The increased number of components on the chip increases the number of interconnections in the finite spaced offered by the chip. Interconnections are usually conducted via bonding pads or solder bumps through a flip-chip technique. Reducing the distance between the bonding pads, or the "pitch" increases the number of interconnects available on the chip, thereby increasing packaging density and reducing packaging weight. Fine pitch assemblies often rely on the ability to etch or deposit very fine traces onto a carrier material to create the interconnects.

FIGS. 1 and 2 illustrate conventionally-known flip-chip technology used to physically and electrically connect a microchip die to a substrate. The substrate includes a conductive pattern for electrically connecting the die to external devices. FIG. 1 shows a die 100 and substrate 102 that are bonded together via solder bumps or bonding pads 104 and 106, respectively. As can be seen in the Figure, the solder bumps 104, 106 are aligned together so that corresponding solder bumps 104, 106 on die 100 and substrate 102 touch only each other and not any other solder bumps 104, 106. If the solder bumps 104, 106 are spaced a relatively large distance apart, that is, if the pitch P allows sufficient spacing in between the solder bumps, alignment is relatively simple even if an automated process is used. The pitch P of the solder relatively simple even if an automated process is used. The pitch P of the solder bumps 104, 106 using this method cannot be reduced to less than 25 microns, making the structure and method shown in FIGS. 1 and 2 unsuitable for applications require very fine pitch structures.

More particularly, if the pitch is reduced beyond the alignment capabilities of the bonding pad structure, the likelihood of misalignment increases as can be seen in FIG. 2. Misalignment can often occur simply because of the difficulty that automated systems have in aligning the solder bumps with the required precision, often causing a given solder bump or bonding pad to touch two other solder bumps or pads to form a undesirable bridge connection. Attempts to increase the precision of alignment between the solder bumps may slow the manufacturing process to such a degree that the overall yield is too low for cost-effective manufacturing.

There is a need for a fine pitch flip chip assembly process that allows cost-effective manufacturing of flip-chip assemblies without encountering the alignment problems present in known processes.

SUMMARY OF THE INVENTION

Accordingly, the present invention is directed to a flip chip method and assembly that is suitable for fine pitch devices. The invention includes applying a conductive layer on a substrate and then forming an interconnect pattern on the conductive layer of the substrate after the conductive portions of a die have been attached to the conductive layer on the substrate. In one embodiment, the die is attached to a substrate having a base layer that supports the conductive layer. A portion of the base layer is cut away to expose the conductive layer, and then the interconnect pattern is etched into the conductive layer via a laser. A sealing layer may be deposited over the exposed conductive layer after etching to protect the interconnect pattern and/or act as a heat sink for the assembly.

Because the interconnect pattern is formed only after the die has been attached to the substrate, the alignment between the conductive portions of the die and the pattern is automatically conducted during the pattern formation process. As a result, there is no need to precisely align the die with any portion of the substrate as the die and substrate are connected together, making the production of fine pitch devices more cost-effective without sacrificing accurate alignment between the conductive portions of the die and the interconnect pattern on the substrate.

DETAILED DESCRIPTION OF THE PREFERRED EMBODIMENT

Figure 1:
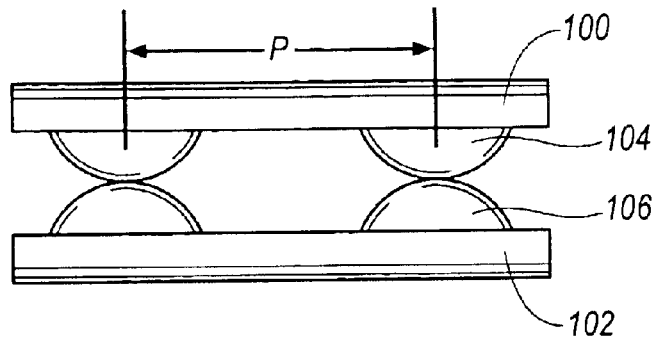
FIG. 1 is a representative diagram of a known flip-chip assembly.
Figure 2:
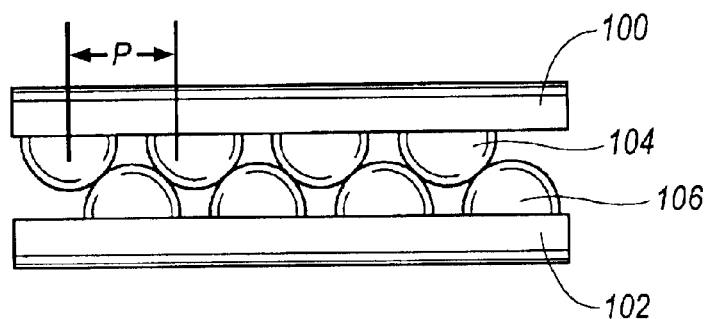
FIG. 2 is another representative diagram of a known flip-chip assembly.
Figure 3:
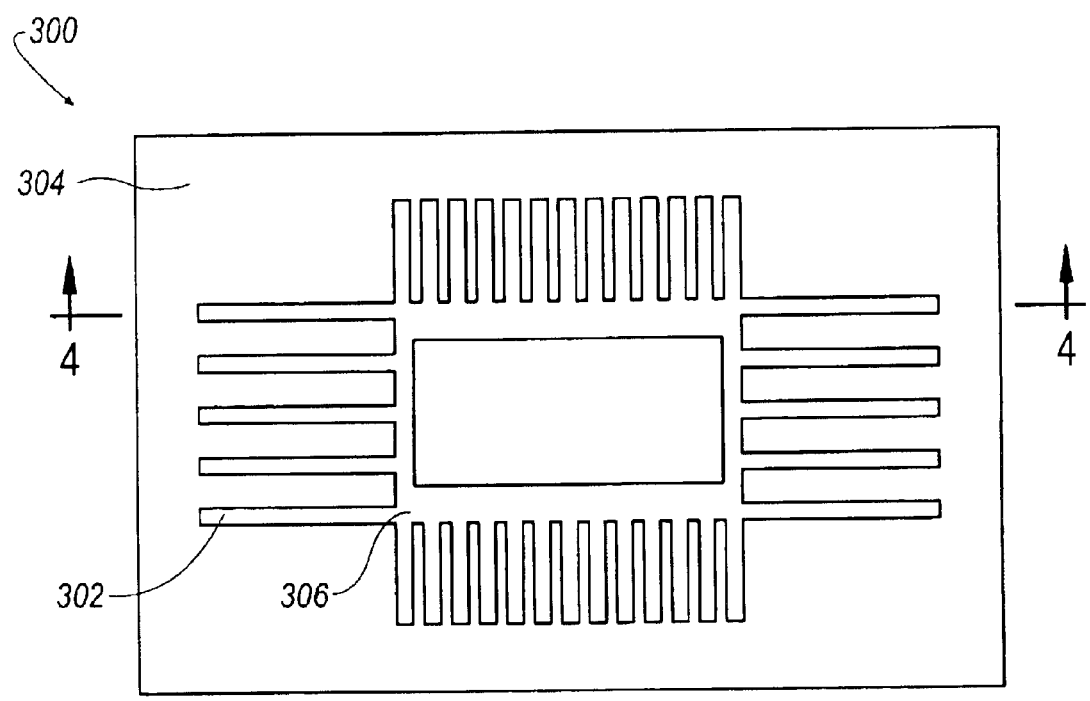
FIG. 3 is a top view of the assembly before die attachment.

FIG. 3 is a top view of a substrate 300 having a conductive pattern 302 disposed on a base layer 304. The substrate 300 preferably begins as a two-layer structure with a conductive material disposed on the base layer 304. Portions of the conductive material are then etched away from the base layer 304 to form a conductive pattern 302. The conductive pattern 302 includes a die attachment area 306 on which a die can be placed. The conductive pattern 302 itself can be frame-shaped, as shown in FIG. 3, or it can include a solid plane of conductive material in the center area of the pattern. The choice of using a frame-shaped or a solid die attachment area 306 depends on the specific interconnect pattern that will eventually be formed in the assembly. If the interconnect pattern will be used to connect solder balls or other conductive pads located only at the periphery of the die, then applying the conductive material in a frame-shaped pattern is sufficient and will reduce the total amount of conductive material that needs to be eventually removed to form the interconnect pattern. If the interconnect pattern is expected to cover areas away from the periphery of the die and closer to the center of the die, the conductive material can be distributed over a greater portion, or even over the entire area, of the die attachment area 306.

As can be seen in FIG. 3, the die attachment area 306 does not have an interconnect pattern and is not separated into discrete bonding pads or conductive traces; instead, the die attachment area 306 is a continuous plane of conductive material on the substrate 300 at the areas where the die will contact the conductive layer 302.

Figure 4:
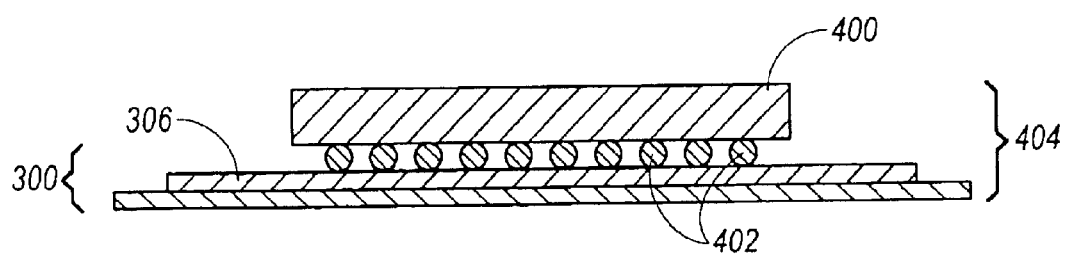
FIG. 4 is a side section view of the assembly in FIG. 3 taken along line 4—4 after die attachment.
Figure 5:
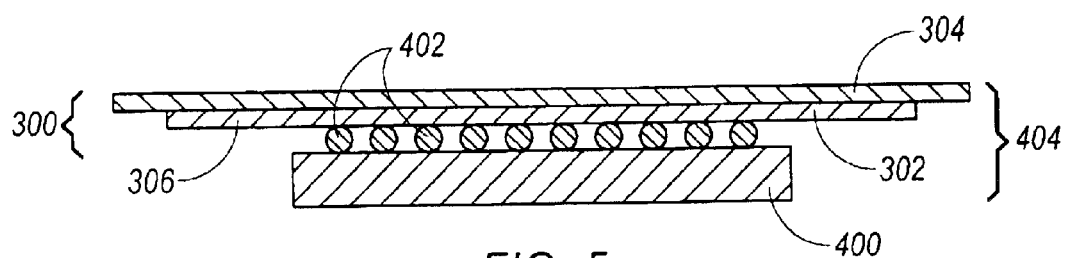
FIG. 5 is a side section view of the assembly in FIG. 4 after the assembly has been flipped.
Figure 9:
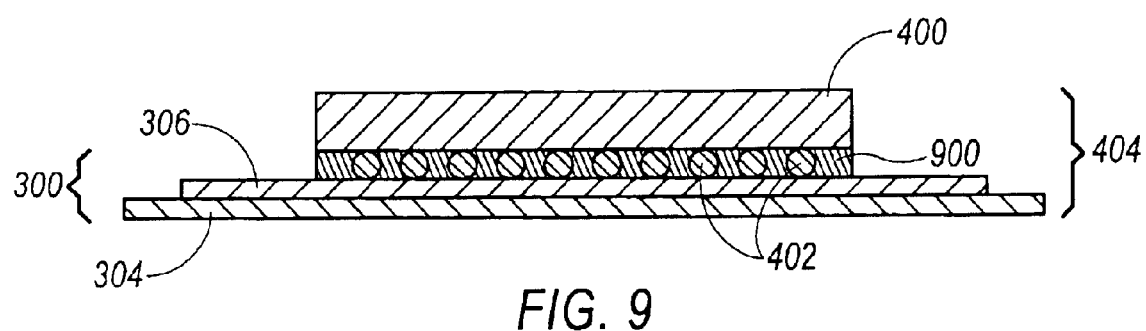
FIG. 9 is a side section view of the assembly in FIG. 3 that includes an underfill and which is taken along line 4—4 after die attachment.

FIGS. 4 and 5 are side cutaway views, along line 4—4 in FIG. 3, of the substrate 300 after a die component 400 is attached to the die attachment area 306. As can be seen in FIGS. 4 and 5, the die 400 has a plurality of solder balls 402 or other conductive protrusions. During manufacturing, the die 400 is flipped and attached to the substrate 300 so that the solder balls 402 contact the conductive die attachment area 306. Once the die 400 is attached to the substrate 300, the entire assembly 404 is flipped to obtain the structure shown in FIGS. 4 and 5, such that the die 400 is at the bottom of the assembly 404 and the base layer 304 of the substrate is at the top of the assembly 404. Additionally, as shown in FIG. 9, an underfill 900 can be injected or otherwise placed between the solder balls 402, substrate 300 and die 400. The underfill 900 can be positioned at this location either after die 400 is attached to substrate 300 or can be placed around the solder balls 402 or on the substrate 300 before attachment. Underfill 900 acts to absorb stresses caused by thermal expansion between the conductive layer and the die 400. As both are commonly made of different material, they can exhibit different expansion coefficients. The underfill 900, therefore, acts to absorb this change and to more securely support both members. Additionally, the underfill 900 acts to dissipate heat away from the IC. The underfill 900 is then carried through the remaining process as described below.

Figure 6:
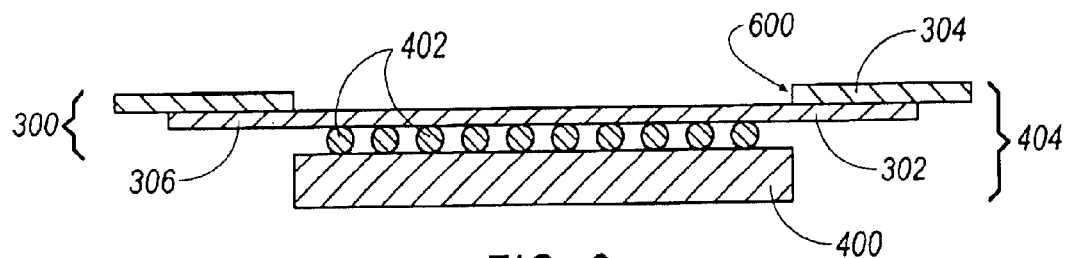
FIG. 6 is a side section view of the assembly in FIG. 5 after removing a portion of the base layer of the assembly.
Figure 7:
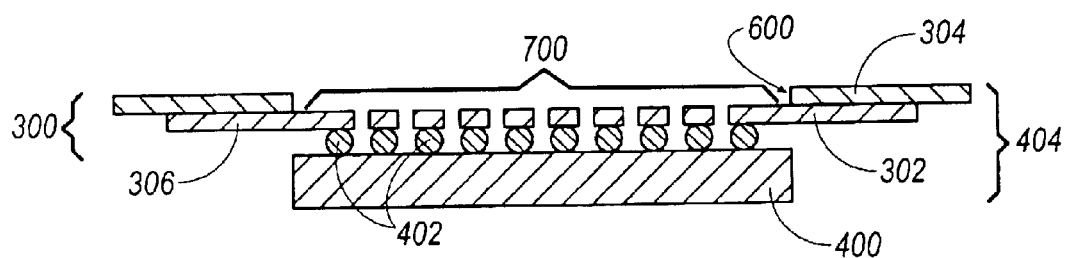
FIG. 7 is a side section view of the assembly after an interconnect pattern has been formed.

Referring to FIGS. 6 and 7, once the assembly 404 has been flipped to place the base layer 304 at the top of the assembly 404, a laser, such as a $CO_2$ laser, or other means is used to cut away a window 600 in the base layer 304 and expose the conductive die attachment area 306 on top of the die 400 and the solder balls 402. As noted in FIG. 3, the conductive material in the die attachment area 306 is preferably continuous at the locations where the solder balls 402 are attached and does not have any pattern thereon that requires alignment with the solder balls 402.

After the window 600 is formed by removing a portion of the base layer 304, a laser or other means cuts away portions of the conductive material in the die attachment area 306 to form a fine pitch interconnect pattern 700. As can be seen in FIG. 7, the laser removes the conductive material joining the solder balls 402 so that the solder balls are coupled to the substrate 300 in accordance with the specific interconnections designed to accomplish the electrical functions of the chip assembly 404. The conductive material that remains after the fine pitch interconnect pattern 700 is etched creates the interconnection between the die 400 and the substrate 300. Because conductive material 302 between the solder balls 402 is removed after the die 400 is joined to the substrate 300, there is no need to align the solder balls 402 with any conductive pads on the substrate; instead, the solder balls 402 are automatically and precisely aligned with the fine pitch interconnect pattern 700 after unnecessary conductive material between the solder balls 402 is etched away. The alignment of the laser system with the interconnect pattern to be etched in the conductive material 302 can be conducted via fiducial marks on the base layer 304 of the substrate 300 to instruct the laser etching system which portions of the conductive material 302 to remove to form the interconnect pattern 700 and which portions to leave behind. For example, the location of the solder balls 402 can be obtained using an X-ray and then correlated with the location of the fiducial marks to guide the laser etching system.

Note that although the above description specifies using a laser to remove the base layer 304 and conductive material 302, other material removal methods can also be used, such as chemical etching. Because precision is not as large of a factor in removing the base layer, chemical etching, an excimer laser, or a frequency-quadrupled YAG laser can all be used to create the window 600. The interconnect pattern requires greater precision; therefore, a YAG laser at prime frequency or a $CO_2$ laser system may be more appropriate for removing the conductive material to form the pattern.

Figure 8:
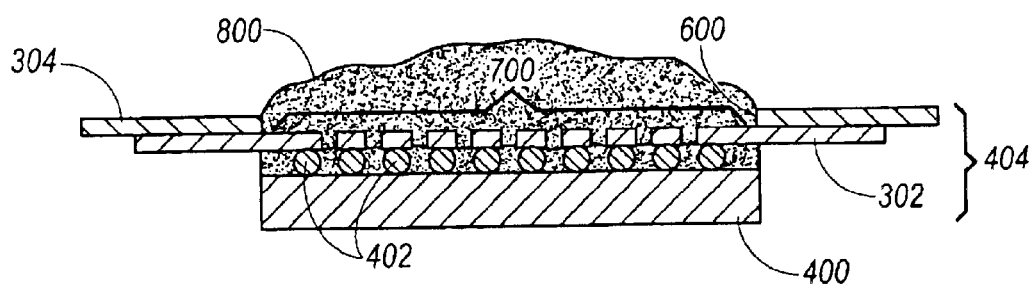
FIG. 8 is a side section view of the assembly after an insulating layer has been disposed on the assembly.
Figure 10:
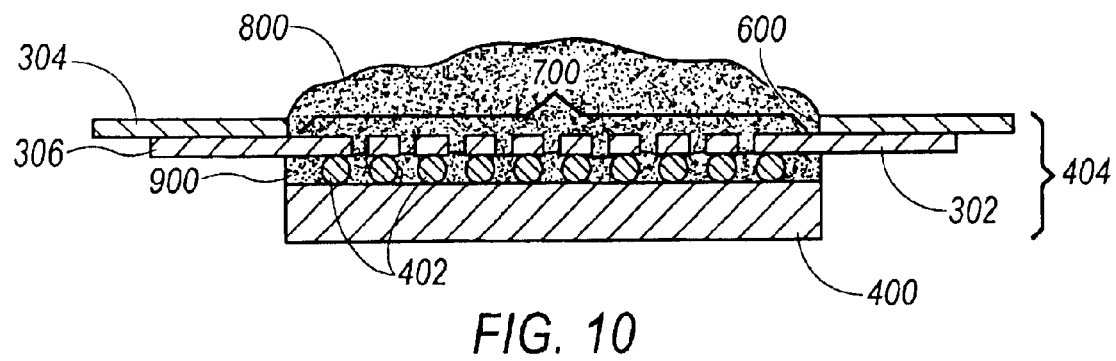
FIG. 10 is a side section view of the assembly including an underfill and after an insulating layer has been disposed on the assembly.

Once the fine pitch interconnect pattern 700 has been formed, a sealing material 800 is deposited in the window portion 600 of the base layer 304 over the interconnect pattern 700, as can be seen in FIG. 8. The sealing material 800 can be used to insulate and protect the conductors of the assembly 400. The sealing material 800 itself can be any material that can flow easily around and through the interconnect pattern 700 and surround the solder balls 402 and pattern 700. For added functionality, the sealing material 800 can be a high thermal conductivity material, thereby acting as a heat sink to direct heat away from the die 400. In the instance where underfill 900 is provided earlier in the process, the sealing material is further added to the underfill 900 as shown in FIG. 10.

By forming the fine pitch interconnect pattern 700 after the die 400 has been connected to the substrate 300 rather than attempting to align solder balls 402 on the die 402 with the interconnect pattern 700, the inventive method allows assembly of fine pitch flip chips without requiring precision alignment steps between the solder balls and pattern on the substrate. The conductive material removal process in essence creates sufficiently precise alignment between the conductive portions of the die and the interconnect pattern without actually carrying out an alignment step. As a result, the yield from the inventive process tends to be larger than other fine pitch chip assembly methods and can be automated more easily.

Figure 11A:
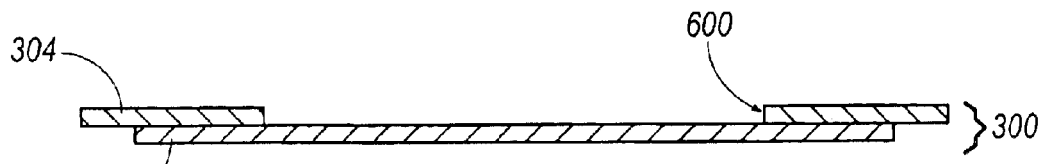
FIGS. 11a–11e are side views of the assembly according to another aspect of the invention.
Figure 11B:
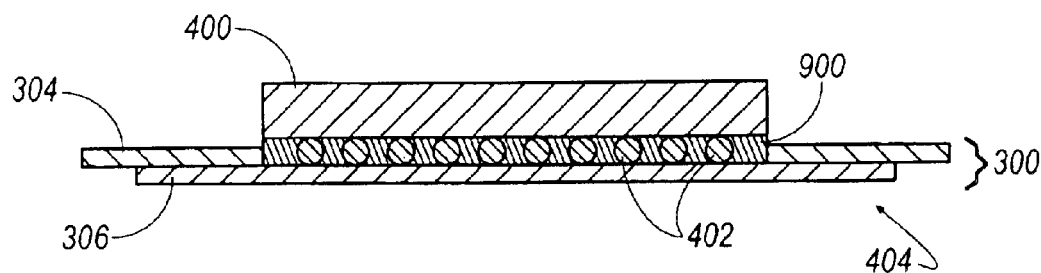

Referring now to FIG. 11A, another embodiment of the present invention is shown and described. FIGS. 11A and 11B are cut away views, along line 4—4 in FIG. 3, of the substrate 300 after window 600 is formed. In the present embodiment, window 600 is cut away from base layer 304 before die attachment area 306 is attached to die 400 by solder balls 402. The formation of window 600 can be effectuated by any of the methods described for previous embodiments including use of a laser or etching.

In FIG. 11B, substrate 300 is preferably maintained at the same position, not flipped, to allow attachment of die 400. Of course, the rotational orientation may be altered from that described herein to effectuate attachment. Die 400 is attached to the substrate 300 such that the solder balls 402 contact the die attachment area 306. Die 400 is attached to die attachment area 306 on a same side as base layer 304 by the methods previously described. Next, as shown in FIG. 9, underfill 900 can be positioned between die 400 and die attachment area 306. This helps ensure rigidity and protection of this area. Of course, addition of underfill 900 is purely optional and one skilled in the art can readily understand that addition of underfill 900 is not necessary for the operation of the present invention.

Figure 11C:
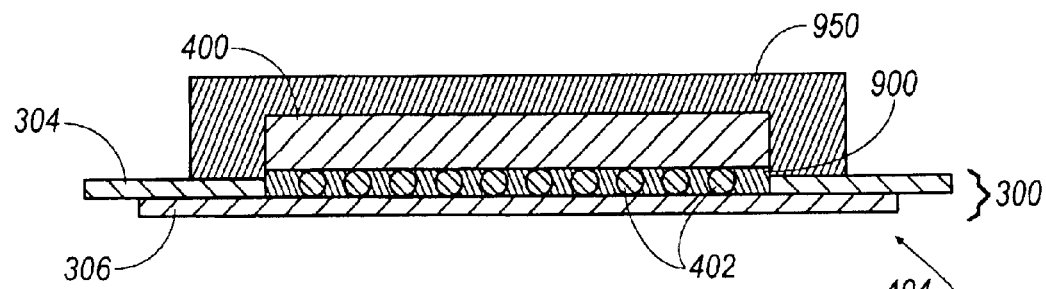

Referring now to FIG. 11C, if desired, heat sink or strengthening member 950 is positioned around die 400. The heat sink or strengthening member 950 acts to vector heat away from die 400 and substrate 300. Heat sink or strengthening member 950 also serves to support the assembly. Of course, addition of heat sink or strengthening member 950 is purely optional, and one skilled in the art will readily understand that addition of this element is not necessary for operation of the present invention.

Figure 11D:
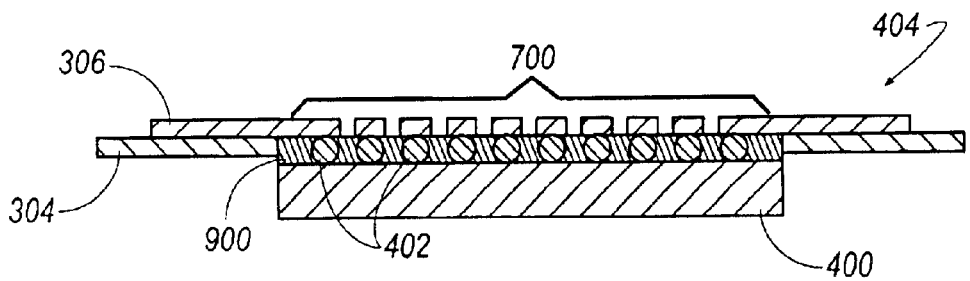
Figure 11E:
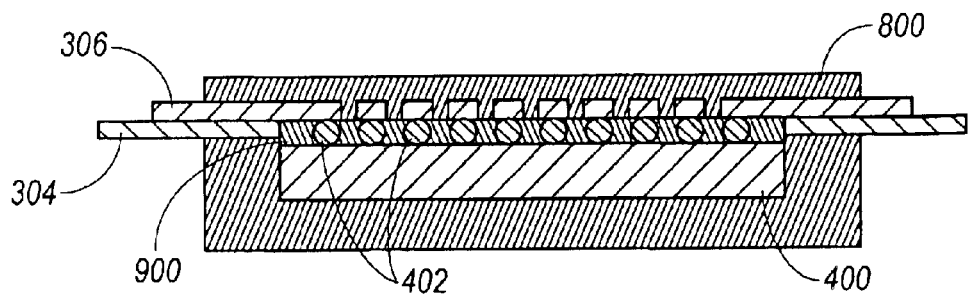

As shown in FIG. 11D, after die 400 is attached to substrate 300, the assembly 404 is then flipped to place new die attachment area 306 at the top of the assembly 404. Then, as described with reference to previous embodiments, a laser or other means cuts away portions of the die attachment area 306 to form a fine pitch interconnect pattern 700. As with previous embodiments, the laser removes the conductive material joining the solder balls 402 so that the solder balls are coupled to the substrate 300 in accordance with the specific interconnections design to accomplish the electrical functions of the chip assembly 404. Moreover, because conductive material between the solder balls 402 is removed after the die 400 is joined to the substrate 300, there is no need to align the solder balls 402 with any conductive pads on the substrate. Lastly, once the fine pitch interconnect pattern 700 has been formed, a sealing material 800 is deposited over interconnect pattern 700 as shown in FIG. 11E. The sealing material 800 insulates and protects the conductors of the assembly 400 and can be any material that flows easily around and through the interconnect pattern solder 100 and surrounds the solder balls 402. If underfill 900 has been disposed around the solder balls 402 as shown in FIG. 9, then the sealing material 800 fills interconnect pattern 700 to position itself atop the underfill 900 and over the pattern 700.

Figure 12A:
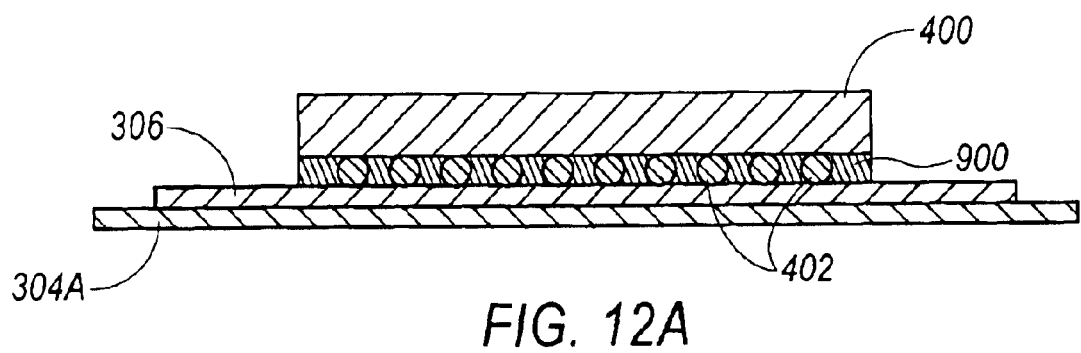
FIGS. 12a–12b are side views of the assembly according to another aspect of the invention.
Figure 12B:
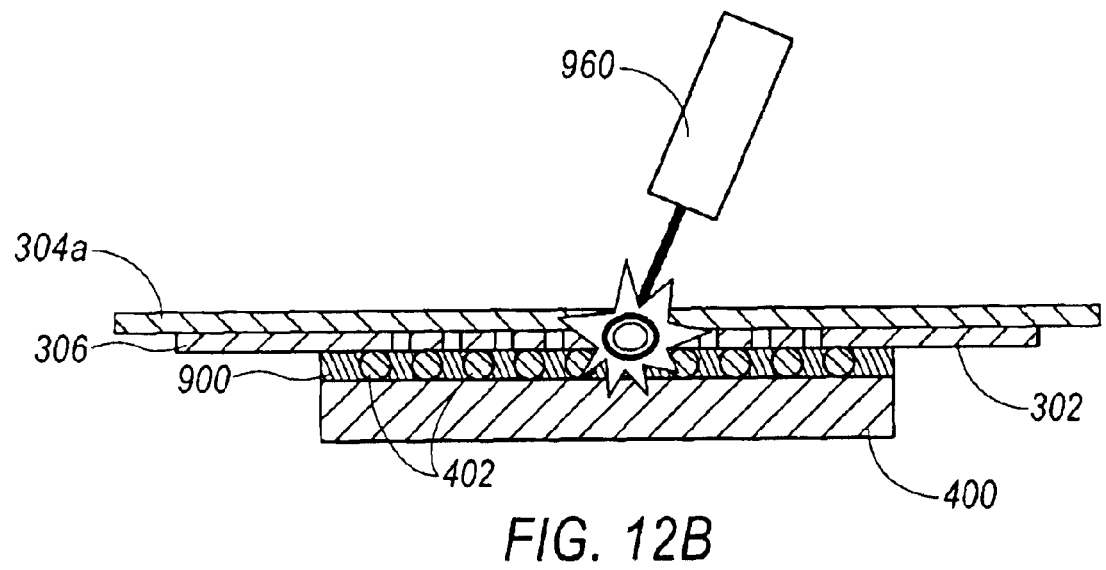

Referring now to FIG. 12A, another aspect of the present invention is shown and described. FIG. 12A provides further features to the steps as shown and described with reference to FIGS. 5 and 6 above. Specifically, base layer 304 is replaced with laser transparent substrate 304a. Laser transparent substrate 304a can be any laser clear material, such as glass. Laser transparent substrate 304a is optically clear to allow laser light to pass therethrough and operate on die attachment area 306 without requiring creation of window 600 beforehand. As shown in FIG. 12B, laser 960 generates an optical beam which passes through laser transparent substrate 304a and into die attachment area 306. As the laser transparent substrate 304a fails to absorb the laser light from laser 950, the energy is focused on die attachment area 306. As shown in FIG. 12B, this laser light causes formation of interconnect pattern 700 below the existing laser transparent substrate 304a. Thereafter, the remaining steps can be processed as described in any of the previous embodiments.

While the invention has been specifically described in connection with certain specific embodiments thereof, it is to be understood that this is by way of illustration and not of limitation, and the scope of the appended claims should be construed as broadly as the prior art will permit.

What is claimed is:

1. A method for forming a flip chip assembly having a substrate portion with a conductive layer and a die portion with a plurality of conductive sections, said method comprising:

attaching the die portion to the substrate portion by connecting die plurality of conductive sections on the die portion to the conductive layer;

positioning an underfill material between the die portion and the substrate portion; and forming an interconnect pattern in the conductive layer after the attaching step.

2. The method according to claim 1, wherein:

the substrate portion includes a base layer abutting a die attachment area;

the method further comprises removing a portion of the base layer abutting the die attachment area before attaching the die portion to the substrate portion.

3. The method according to claim 2, wherein the removing of a portion of the base layer is performed at least in part by chemical etching.

4. The method according to claim 1, wherein the forming of an interconnect pattern is performed at least in part using a laser.

5. The method according to claim 1, further comprising applying a sealing layer over the interconnect pattern and the underfill material.

6. The method according to claim 5, wherein the sealing layer is comprised of a material with high thermal conductivity.

7. The method of claim 1, wherein said positioning step is performed before said attaching step.

8. The method of claim 1, wherein said positioning step is performed after said attaching step and before said forming step.

9. The method of claim 1, wherein said positioning step is performed after said forming step.

10. The method according to claim 1, wherein:

the substrate portion includes a base layer abutting a die attachment area; and the method further comprises removing a portion of the base layer abutting the die attachment area after attaching the die portion to the substrate portion.

11. A method for fanning a flip chip assembly having a substrate portion with a base layer and a conductive layer and a die portion with a plurality of conductive sections, comprising:

defining a die attachment area on the substrate portion;

removing a portion of the base layer on the die attachment area;

attaching the die portion to the substrate portion by connecting the plurality of conductive sections on the die portion to portions of the die attachment area where the base layer has been removed; and forming an interconnect pattern on the conductive layer after the attaching of the die portion to the substrate portion.

12. The method according to claim 11, wherein an underfill material is positioned between the die portion and the die attachment area before the forming of the interconnect pattern.

13. The method according to claim 11, further comprising forming a heat sink or a strengthening member over the die portion after the attaching of the die portion to the substrate portion.

14. A method for forming a flip chip assembly having a substrate portion with a base layer and a conductive layer and a die portion with a plurality of conductive sections, comprising:

provide a laser transparent material as the base layer;

defining a die attachment area on the substrate portion;

attaching the die portion to the substrate portion by connecting the plurality of conductive sections on the die portion to the die attachment area on the conductive layer;

forming an interconnect pattern in the conductive layer after attaching the die portion to the substrate portion by projecting a laser through the laser transparent material and into the conductive layer; and removing a portion of the base layer proximate the interconnect pattern and the die attachment area.

15. The method according to claim 14, wherein the removing of a portion of the base layer includes chemical etching.

16. The method according to claim 14, wherein an underfill layer is positioned between the die portion and the conductive layer before forming an interconnect pattern in the conductive layer.

* * * * *

UNITED STATES PATENT AND TRADEMARK OFFICE
CERTIFICATE OF CORRECTION

PATENT NO. : 6,846,701 B2
DATED : January 25, 2005
INVENTOR(S) : Timothy Patterson It is certified that error appears in the above-identified patent and that said Letters Patent is hereby corrected as shown below:

Column 6,
Line 7, delete "die" and insert -- the --
Line 44, delete "fanning" and insert -- forming --

Signed and Sealed this

Tenth Day of May, 2005

JON W. DUDAS
*Director of the United States Patent and Trademark Office*